(12) United States Patent  (10) Patent No.: US 8,988,889 B2
Yu et al.  (45) Date of Patent: Mar. 24, 2015

(54) CONNECTION WIRE STRUCTURE OF DIRECT LIGHT BAR AND CONNECTION METHOD THEREOF

(75) Inventors: Yajun Yu, Guangdong (CN); Yuchun Hsiao, Guangdong (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 255 days.

(21) Appl. No.: 13/521,049

(22) PCT Filed: Jun. 5, 2012

(86) PCT No.: PCT/CN2012/076458
§ 371 (c)(1),
(2), (4) Date: Jul. 7, 2012

(87) PCT Pub. No.: WO2013/177804
PCT Pub. Date: Dec. 5, 2013

(65) Prior Publication Data
US 2013/0322066 A1    Dec. 5, 2013

(51) Int. Cl.
*H05K 1/00* (2006.01)
*H01R 12/71* (2011.01)
*H01R 25/00* (2006.01)

(52) U.S. Cl.
CPC ............ *H01R 25/003* (2013.01); *H01R 12/716* (2013.01); *Y10T 29/49117* (2013.01)

USPC .......................................... 361/760; 361/761

(58) Field of Classification Search
USPC .................... 361/760, 761; 362/225
See application file for complete search history.

(56) References Cited

U.S. PATENT DOCUMENTS

2012/0205534 A1*  8/2012  Hunter et al. ................. 250/282

FOREIGN PATENT DOCUMENTS

CN    201059154 Y    5/2008
CN    101413631 A    4/2009

* cited by examiner

*Primary Examiner* — Andargie M Aychillhum
(74) *Attorney, Agent, or Firm* — Cheng-Ju Chiang

(57) ABSTRACT

The present invention relates to a connection wire structure of a direct light bar and a connection method thereof. The connection wire structure of the direct light bar includes a plurality of light bars and connection wires, and a circuit board. Each light bar includes a wiring board that includes a first exposed copper zone that includes a hole to serve as a circuit connection contact. The circuit board includes a second exposed copper zone that includes a hole to serve as a circuit connection contact. Each of the connection wires has two ends to each of which a copper ring is connected. The two copper rings of each of the connection wires are respectively connected to the first exposed copper zones or the second exposed copper zones corresponding thereto by coupling pieces so as to establish electrical connection. A connection method of the direct light bar is also provided.

5 Claims, 3 Drawing Sheets

CONNECTION WIRE STRUCTURE OF DIRECT LIGHT BAR AND CONNECTION METHOD THEREOF

BACKGROUND OF THE INVENTION

1. Field of the Invention

The present invention relates to the technical field of backlighting, and in particular to a connection wire structure of a direct light bar and a connection method thereof.

2. The Related Arts

The fast progress of flat display technology in recent years makes liquid crystal displays (LCDs) widely used in various information appliances, communication devices, and consumer products due to various advantages of for example compact size, light weight, high image quality, and low driving voltage. The liquid crystal that is contained in a liquid crystal display panel of an LCD does not posses any light emitting characteristic and thus, a light source device, such as a backlight module, which supplies light of sufficient illumination and uniform distribution to the liquid crystal display panel, must be provided to the liquid crystal display panel of LCD in order to effect adjustment of displaying illumination of the LCD. According to the location of the backlight module relative to the liquid crystal display panel, the backlight module is classified as a direct backlight module that is installed on the back side of the liquid crystal panel and a side-edge backlight module that is arranged at the circumference of the liquid crystal panel.

The fast development of backlighting technique for backlight module brings light-emitting diode (LED) based backlighting into industrialization, gradually taking the place of cold cathode fluorescent lamp (CCFL) as the main stream of backlight source for backlight module. Consequently, LEDs are gradually used in the direct backlight module as a backlight source to replace the fluorescent lamps.

In a backlight module that uses LED as a backlight source, LED chips are mounted to a flexible printed circuit (FPC) or a printed circuit board (PCB) to make an LED light bar that then serves as a backlight source to be incorporated in a backlight module of liquid crystal display panel. For a conventional direct backlight module, a large number of light bars are used and they are connected to each other through terminals. As shown in FIG. 1, a schematic view of a conventional connection wire structure of direct backlight module is given. The conventional connection wire structure of direct backlight module comprises a plurality of light bars 100, a plurality of wires 200, a circuit board 300, a female connector 301 mounted to the circuit board 300, a female connector 103 mounted to each of the light bar 100 through pick-and-place operation, and a plurality of male connectors 201 for connecting the connection wires 200. The male connector 201 are bonded to the connection wires 200 by using a pick-and-place machine in such a way that each male connector 201 is connected between two connection wires 200 to thereby sequentially connect all the male connectors 201 and the all the connection wires 200 together to form a wire harness. Each light bar 100 comprises a wiring board 102 and a plurality of LED chips 101 mounted to the wiring board 102. The wiring board 102 can be an FPC or a PCB. The light bar 100 also comprises the female connector 103 that is mounted thereto through pick-and-place operation. Through male-female mating engagement in a one-to-one manner, between the male connectors 201 and the female connectors 103 and the female connector 301, the light bars 100, the connection wires 200, and the circuit board 300 are connected to form a loop and thus achieving the backlighting function. This arrangement suffers a severe drawback that increasing or decreasing one light bar 100 would require an increase or decrease of the quantity of male connectors 201 used. Since the male connectors 201 and the connection wires 200 are securely bonded together through pick-and-place operation, such a known arrangement would lead to the conclusion of additional pick-and-place operation must be carried out to make the additional connection wire 200. This causes a waste of wire cost and the shareability of the wire is poor.

SUMMARY OF THE INVENTION

Thus, an object of the present invention is to provide a novel connection wire structure of a direct light bar and a connection method thereof, which meets the need of shareability of connection wires when the number of light bars is increased or decreased.

To achieve the object, the present invention provides a connection wire structure of a direct light bar, which comprises a plurality of light bars, a plurality of connection wires, and a circuit board. Each of the light bars comprises a wiring board that comprises a first exposed copper zone that comprises a hole to serve as a circuit connection contact. The circuit board comprises a second exposed copper zone that comprises a hole to serve as a circuit connection contact. Each of the connection wires has two ends to each of which a copper ring is connected. The two copper rings of each of the connection wires are respectively connected to the first exposed copper zones or the second exposed copper zones corresponding thereto by coupling pieces so as to establish electrical connection.

Wherein, the coupling pieces comprise bolts.

Wherein, the coupling pieces comprise pins.

Wherein, the copper rings are connected to the two ends of each of the connection wires through pick-and-place operation.

The present invention also provides a connection method of direct light bar, comprising the following steps:

(1) mounting a copper ring to each of two ends of each connection wire;

(2) forming a first exposed copper zone that comprises a hole in a wiring board of each light bar to serve as a circuit connection contact;

(3) forming a second exposed copper zone that comprises a hole in a circuit board to serve as a circuit connection contact; and (4) connecting the two copper rings of each connection wire by coupling pieces to the holes of the first exposed copper zones or the second exposed copper zone corresponding thereto to establish circuit connection.

Wherein, the coupling pieces comprise bolts.

Wherein, the coupling pieces comprise pins.

Wherein, the copper rings are connected to the two ends of each of the connection wires through pick-and-place operation.

The present invention provides a connection wire structure of a direct light bar and a connection method thereof, which meet the need of wire sharing in case of increase or decrease of the number of light bars. When the number of light bars is increased or decreased, it can be easily handled by increasing or decreasing one copper ring mounted connection wire. There is no need to carry out an additional pick-and-place operation of making the connection wire harness so that the cost and the pick-and-place operation time are reduced thereby realizing shareability of wires of various types and various quantities.

BRIEF DESCRIPTION OF THE DRAWINGS

The technical solution, as well as beneficial advantages, will be apparent from the following detailed description of an embodiment of the present invention, with reference to the attached drawings. In the drawings.

DETAILED DESCRIPTION OF THE PREFERRED EMBODIMENTS

Figure 1:
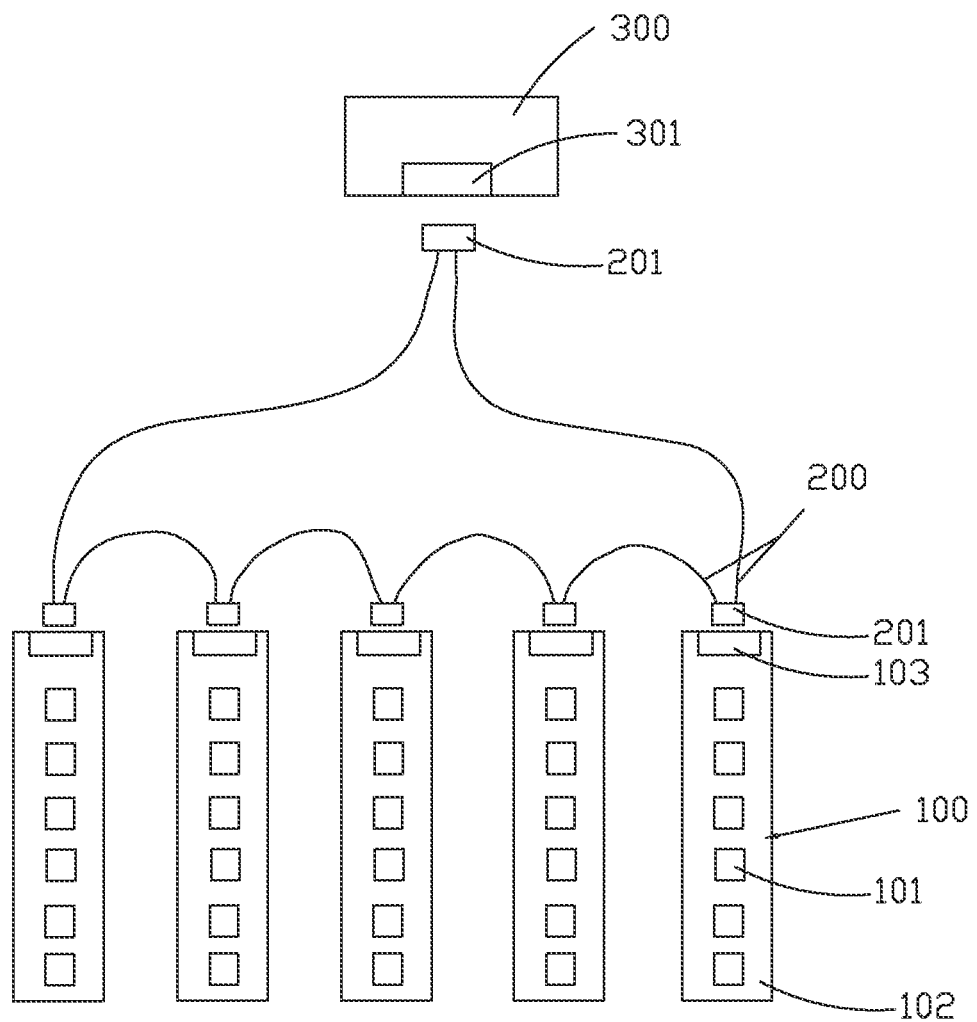
FIG. 1 is a schematic view showing a conventional connection wire structure of a direct light bar.
Figure 2:
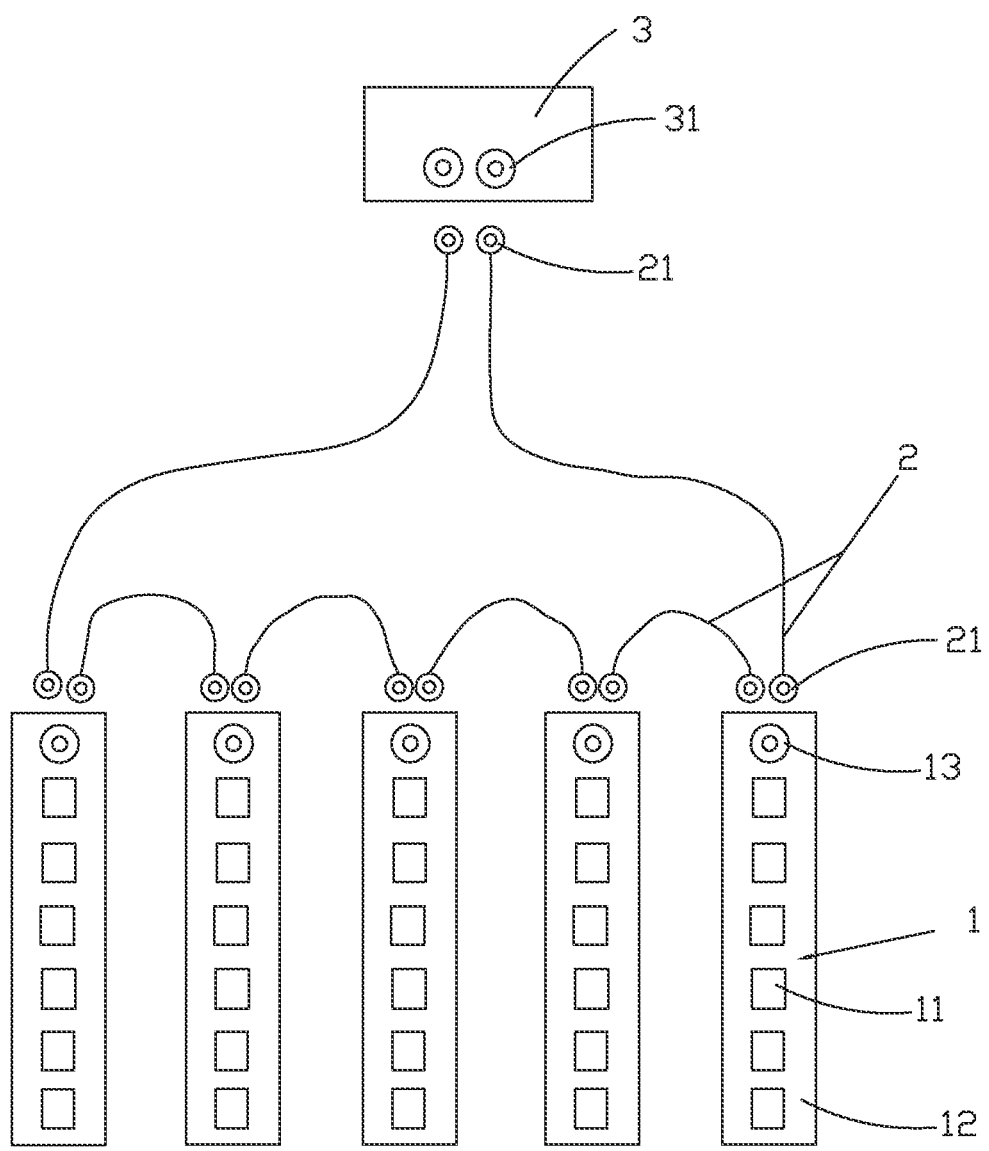
FIG. 2 is schematic view showing a preferred embodiment of connection wire structure of a direct light bar according to the present invention.

Referring to FIG. 2, a schematic view of a preferred embodiment of connection wire structure of a direct light bar according to the present invention is shown. The connection wire structure of direct light bar according to the present invention comprises a plurality of light bars 1, a plurality of connection wires 2, and a circuit board 3. Each of the light bars 1 comprises a wiring board 12 and a plurality of light-emitting diode (LED) chips 11 mounted to the wiring board 12. The wiring board 12 can be a flexible printed circuit (FPC) or a printed circuit board (PCB). The wiring board 12 of each light bar 1 comprises a holed exposed copper zone 13 serving as a circuit connection contact. The circuit board 3 comprises a holed exposed copper zone 31 serving as a circuit connection contact. Each connection wire 2 has two ends each connected with a copper ring 21. To assemble, according a predetermined light bar circuit, the copper rings 21 of each connection wire 2 are respectively connected by coupling pieces to the holes of the corresponding exposed copper zones 31, 13 for conduction of circuit. The coupling pieces can be bolts or pins. The copper rings 21 can be mounted to the two ends of each connection wire 2 by a pick-and-place machine.

Figure 3:
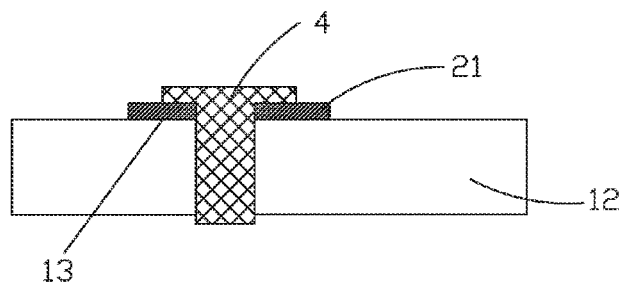
FIG. 3 is a cross-sectional view taken in a conduction site of a light bar after the assembling of the embodiment of FIG. 2.

Referring to FIG. 3, a cross-sectional view taken in a conduction site of a light bar after the assembling of the embodiment of FIG. 2 is given. The coupling piece 4 is inserted into the corresponding copper ring 21 and the hole centered in the exposed copper zone 13 of the wiring board 12 to establish electrical connection.

Figure 4:
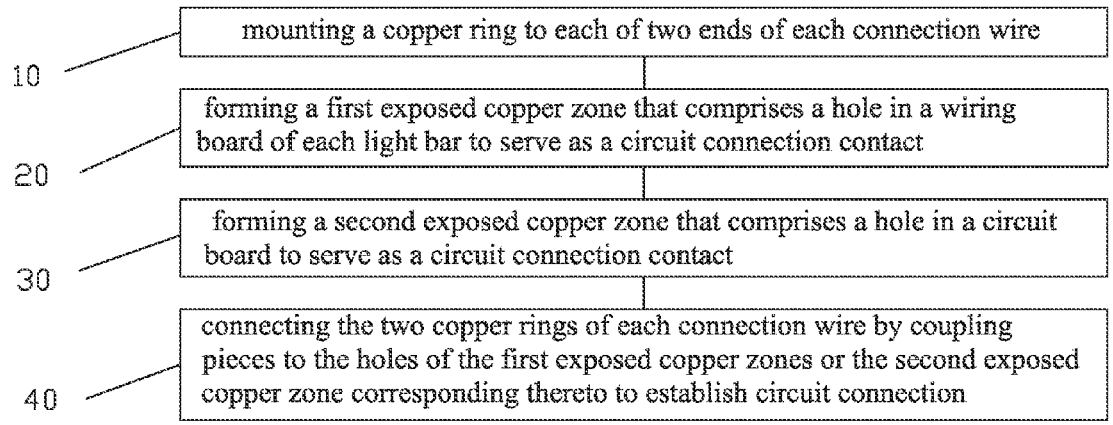
FIG. 4 is a flow chart showing a preferred embodiment of a connection method of the direct light bar according to the present invention.

Referring to FIG. 4, a flow chart showing a preferred embodiment of connection method of the direct light bar according to the present invention is given. The connection method of direct light bar according to the present invention comprises the following steps:

Step 10: mounting a copper ring to each of two ends of each connection wire;

Step 20: forming a first exposed copper zone that comprises a hole in a wiring board of each light bar to serve as a circuit connection contact;

Step 30: forming a second exposed copper zone that comprises a hole in a circuit board to serve as a circuit connection contact; and Step 40: connecting the two copper rings of each connection wire by coupling pieces to the holes of the first exposed copper zones or the second exposed copper zone corresponding thereto to establish circuit connection.

Compared to the conventional way of connection, the connection method according to the present invention omits the male connectors that are mounted to connection wires and also eliminates the female connectors that are mounted to the circuit board and the light bar so that the cost is greatly saved. A copper ring is mounted to each of two ends of each connection wire and an exposed copper zone that comprises a hole is formed on the site at an end of the circuit board where the female connector was originally located. A center of the copper ring of the connection wire is set alignment with the hole of the exposed copper zone at the end of the circuit board and a pin or a bolt is applied to fix them together to establish electrical connection.

In summary, the present invention provides a connection wire structure of direct light bar and a connection method thereof, which meet the need of wire sharing in case of increase or decrease of the number of light bars. When the number of light bars is increased or decreased, it can be easily handled by increasing or decreasing one copper ring mounted connection wire. There is no need to carry out an additional pick-and-place operation of making the connection wire harness so that the cost and the pick-and-place operation time are reduced thereby realizing shareability of wires of various types and various quantities.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A connection wire structure of a direct light bar, comprising a plurality of light bars, a plurality of connection wires, and a circuit board, each of the light bars comprising a wiring board that comprises a first exposed copper zone that comprises a hole to serve as a circuit connection contact, the circuit board comprising a second exposed copper zone that comprises a hole to serve as a circuit connection contact, each of the connection wires having two ends to each of which a copper ring is connected, the two copper rings of each of the connection wires being respectively positioned on and in alignment with the first exposed copper zones or the second exposed copper zones corresponding thereto and are connected thereto by coupling pieces so as to establish electrical connection between each of the two copper rings and the corresponding first or second exposed copper zone, whereby the circuit board and the wiring boards of the light bars are electrically connected by the connection wires.

2. The connection wire structure of a direct light bar as claimed in claim 1, wherein the coupling pieces comprise bolts.

3. The connection wire structure of a direct light bar as claimed in claim 1, wherein the coupling pieces comprise pins.

4. The connection wire structure of a direct light bar as claimed in claim 1, wherein the copper rings are connected to the two ends of each of the connection wires through pick-and-place operation.

5. A connection wire structure of a direct light bar, comprising a plurality of light bars, a plurality of connection wires, and a circuit board, each of the light bars comprising a wiring board that comprises a first exposed copper zone that comprises a hole to serve as a circuit connection contact, the circuit board comprising a second exposed copper zone that comprises a hole to serve as a circuit connection contact, each of the connection wires having two ends to each of which a copper ring is connected, the two copper rings of each of the connection wires being respectively positioned on and in alignment with the first exposed copper zones or the second exposed copper zones corresponding thereto and are connected thereto by coupling pieces so as to establish electrical connection between each of the two copper rings and the corresponding first or second exposed copper zone, whereby the circuit board and the wiring boards of the light bars are electrically connected by the connection wires;

wherein the coupling pieces comprise bolts or pins; and wherein the copper rings are connected to the two ends of each of the connection wires through pick-and-place operation.

* * * * *